United States Patent [19]

Weber

[11] Patent Number: 5,323,299

[45] Date of Patent: Jun. 21, 1994

[54] EMI INTERNAL SHIELD APPARATUS AND METHODS

[75] Inventor: William F. Weber, Allen, Tex.

[73] Assignee: Alcatel Network Systems, Inc., Richardson, Tex.

[21] Appl. No.: 40,588

[22] Filed: Mar. 31, 1993

Related U.S. Application Data

[63] Continuation of Ser. No. 834,753, Feb. 12, 1992, abandoned.

[51] Int. Cl.$^5$ .............................................. H05K 9/00
[52] U.S. Cl. ............................... 361/818; 174/35 R; 174/35 GC
[58] Field of Search ........... 174/35 R, 35 GC, 35 TS, 174/51; 361/818; 439/108, 109, 607, 608, 609; 257/659

[56] References Cited

U.S. PATENT DOCUMENTS

| | | | |
|---|---|---|---|
| 3,816,911 | 6/1974 | Knappenberger | 174/35 R |
| 4,370,515 | 1/1983 | Donaldson | 174/35 R |
| 4,494,095 | 1/1985 | Noji et al. | 174/35 R |
| 4,583,150 | 4/1986 | Boonstra | 174/35 R |
| 4,661,888 | 4/1987 | Jewell et al. | 361/424 |
| 4,754,101 | 6/1988 | Stickney et al. | 174/35 R |
| 4,800,464 | 1/1989 | Roos et al. | 174/35 R |
| 5,014,160 | 5/1991 | McCoy, Jr. | 361/424 |
| 5,053,924 | 10/1991 | Kurgan | 361/424 |
| 5,067,232 | 11/1991 | Seidel et al. | 174/35 R |
| 5,107,404 | 4/1992 | Tam | 361/424 |
| 5,160,807 | 11/1992 | Fry et al. | 174/35 R |

FOREIGN PATENT DOCUMENTS

| | | | |
|---|---|---|---|
| 3211758 | 10/1983 | Fed. Rep. of Germany | 361/424 |
| 3537653 | 4/1987 | Fed. Rep. of Germany | 361/424 |
| 3629913 | 3/1988 | Fed. Rep. of Germany | 174/35 R |
| 3736833 | 5/1989 | Fed. Rep. of Germany | 174/35 GC |
| 3809607 | 10/1989 | Fed. Rep. of Germany | 361/424 |
| 4037763 | 6/1992 | Fed. Rep. of Germany | 361/818 |
| 2652227 | 3/1991 | France | 439/607 |
| 1-145897 | 6/1989 | Japan | 174/35 R |
| 02-47896 | 2/1990 | Japan | 361/424 |
| 2-239699 | 9/1990 | Japan | 361/424 |
| 2-263499 | 10/1990 | Japan | 361/424 |
| 3-160790 | 7/1991 | Japan | 361/424 |
| 2214000 | 8/1989 | United Kingdom | 174/35 R |

Primary Examiner—Leo P. Picard
Assistant Examiner—Donald A. Sparks
Attorney, Agent, or Firm—Baker & Botts

[57] ABSTRACT

An EMI internal shield made of an electrically conductive material that absorbs and reflects electromagnetic interference (EMI) signals associated to fit with an EMI shield top cover. The EMI internal shield is formed to fit without solder or welding as an EMI shield apparatus over EMI susceptible electronic circuitry on a printed circuit board. The EMI internal shield apparatus not only shields circuitry from EMI sources external to the printed circuit board, but also isolates certain electronic circuits from other electronic circuitry on the printed circuit board. Additionally, the EMI internal shield permits the communication of desired electromagnetic radio frequency and electrical signals to the circuitry inside the shield. The EMI internal shield apparatus includes the use of an electrically conductive layer that is integral to the top of the printed circuit board and which includes conductive channels that penetrate the printed circuit board. The channels prevent EMI from passing through the printed circuit board to the shielded electronic circuits. Also, the channels receive tangs found on the EMI internal shield. The tangs are positioned to prevent EMI from passing through the juncture of the EMI internal shield with the conductive layer. As EMI signals reach the EMI internal shield, they are absorbed and conducted to an electrical ground or reflected from the EMI internal shield. Signal trace openings through the conductive layer permit electrical leads from the electronic circuitry to connect to external circuitry.

7 Claims, 5 Drawing Sheets

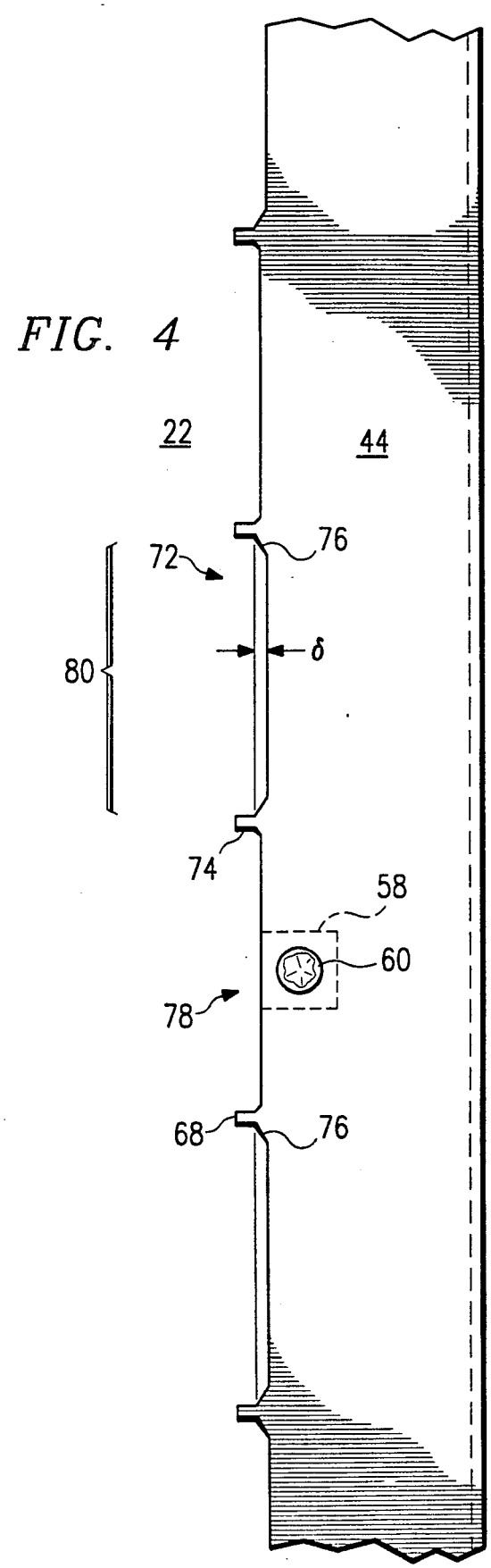
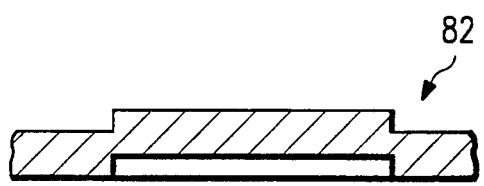
FIG. 4
FIG. 5

EMI INTERNAL SHIELD APPARATUS AND METHODS

CROSS REFERENCE TO RELATED APPLICATIONS

This application is a continuation of application Ser. No. 07/834,753 filed Feb. 12, 1992, entitled "EMI Internal Shield Apparatus and Methods" by William F. Weber, now abandoned.

TECHNICAL FIELD OF THE INVENTION

The present invention is related generally to electronics, and more specifically to packaging of electronics to limit the communication of EMI (electromagnetic interference) signals. Even more specifically, the invention is related to packaging certain electronic circuits of the electronic circuitry on a printed circuit board within an EMI shield that shields the certain electronic circuits from external EMI and internal EMI that may come from the remaining electronic circuitry, while permitting desired electromagnetic radio frequency and electrical signals to communicate with the certain electronic circuits.

BACKGROUND OF THE INVENTION

The prior art packaging of printed circuit boards containing electronic circuitry to prevent EMI signals from leaving the package or from reaching and adversely affecting highly-susceptible electronic circuitry within the package is both labor intensive to manufacture and service and suffers from several functional limitations. Keeping EMI from leaving an electronics module that contains EMI-emitting components has required soldering certain shielding materials to the printed circuit board and fastening other shielding materials to the soldered shielding material using various screws or other fastening hardware. Keeping EMI from reaching and affecting susceptible electronic circuits in an electronics module, on the other hand, has required placing the printed circuit board fully in a sealed box made of a material that effectively shields most of the EMI signals.

U.S. patent application Ser. No. 07/834,908, entitled "EMI Shield Apparatus and Methods" by W. F. Weber and assigned to "the assignee of the present invention" (the Weber Shield) describes a solderless EMI shield apparatus that overcomes the limitations of prior art devices. Even with the improvements of the Weber Shield, there is a need for an EMI internal shield that effectively separates certain electronic circuits from the rest of the electronic circuitry on a printed circuit board. For example, if certain electronic circuits under the Weber Shield require isolation or shielding from the remaining circuitry, there is no known apparatus or method that provides a solderless, easily removable internal shield. Prior art devices for internal shielding require labor-intensive welding or soldering of multiple shield pieces that may later inhibit repair or replacement of electronic circuitry.

It is an object of the present invention, therefore, to provide an EMI internal shield that may be used with an EMI shield such as the Weber Shield and that effectively separates certain electronic circuits from other electronic circuitry on a printed circuit board to shield the certain electronic circuits from EMI that the other electronic circuitry emits and EMI that may penetrate through the EMI shield, while permitting communication of desired electromagnetic radio frequency and electrical signals with the certain electronic circuits.

BRIEF DESCRIPTION OF THE DRAWINGS

Other objects and advantages of the present invention will be apparent from a reading of the specification and appended claims in conjunction with the drawings, wherein:

FIG. 4 shows a view of the top cover to illustrate the design of shield grounding tangs and trace signal passageways of the preferred embodiment;

FIG. 5 shows a side cut-away view of a portion of the bottom cover of the preferred embodiment.

DETAILED DESCRIPTION OF THE INVENTION

Figure 1:
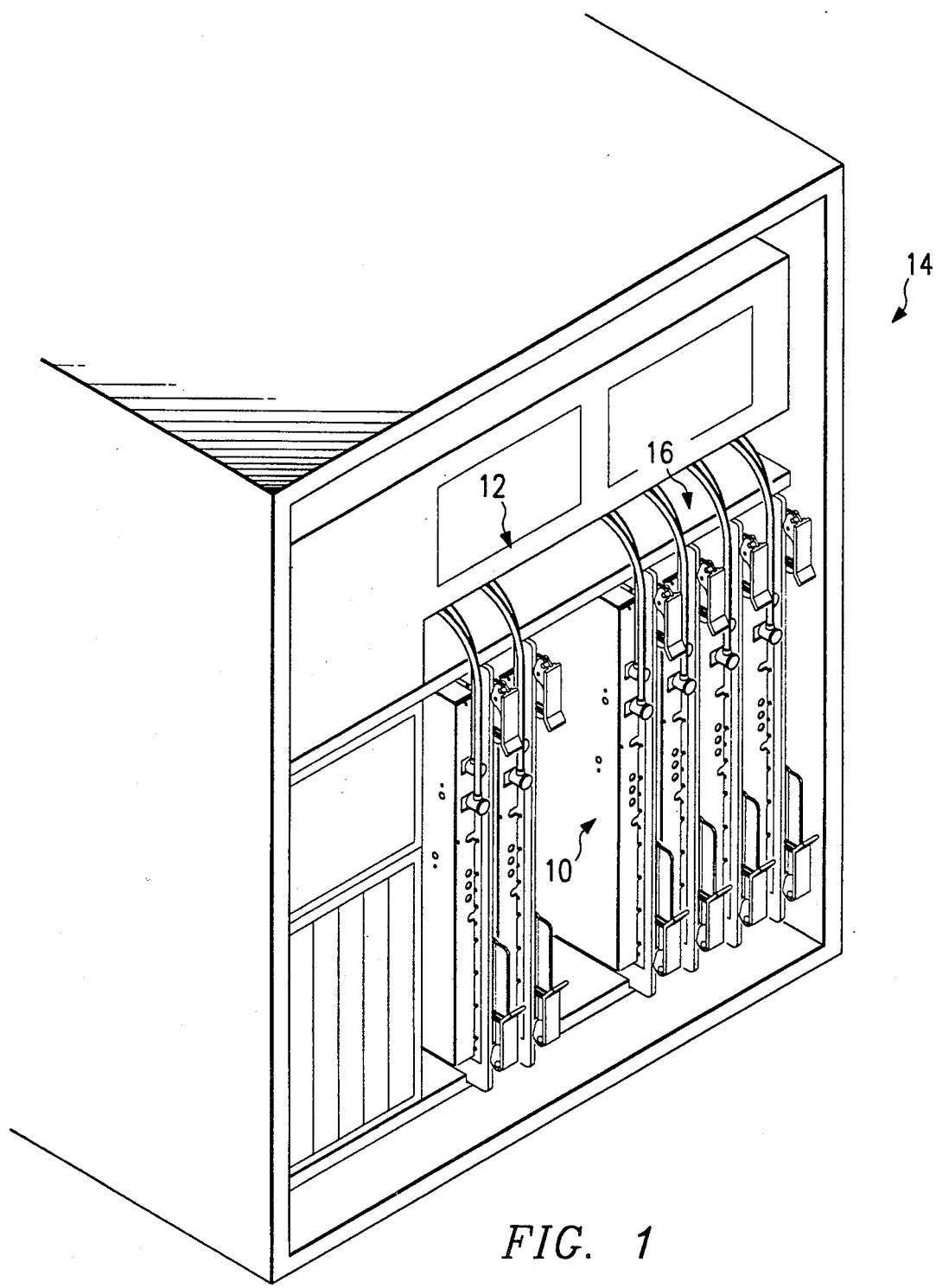
FIG. 1 shows a card cage of a communications electronics cabinet that may establish a typical physical and EMI environment for the present invention.

In FIG. 1 appears a typical environment for employing the preferred embodiment of the present invention. Electronics module 10 may, for example, be a communications receiver module that fits within card cage 12 of communications electronics cabinet 14. Electronics cabinet 14 may contain a plurality of such communications electronics modules 10 plugged side-by-side in slots such as slot 16. Communications electronics cabinet 14 receives each of the electronics modules 10 and electrically connects circuitry inside each electronic module 10 to other components of communications electronics cabinet 14. Communications electronics modules 10 may take a low level signal from a remote transmitter and amplify the signal, separate an information portion of the signal from a carrier portion, and add information to the signal. It is very important that EMI not adversely affect these operations. Therefore, the embodiment of the present invention provides this necessary EMI shielding.

Figure 2:
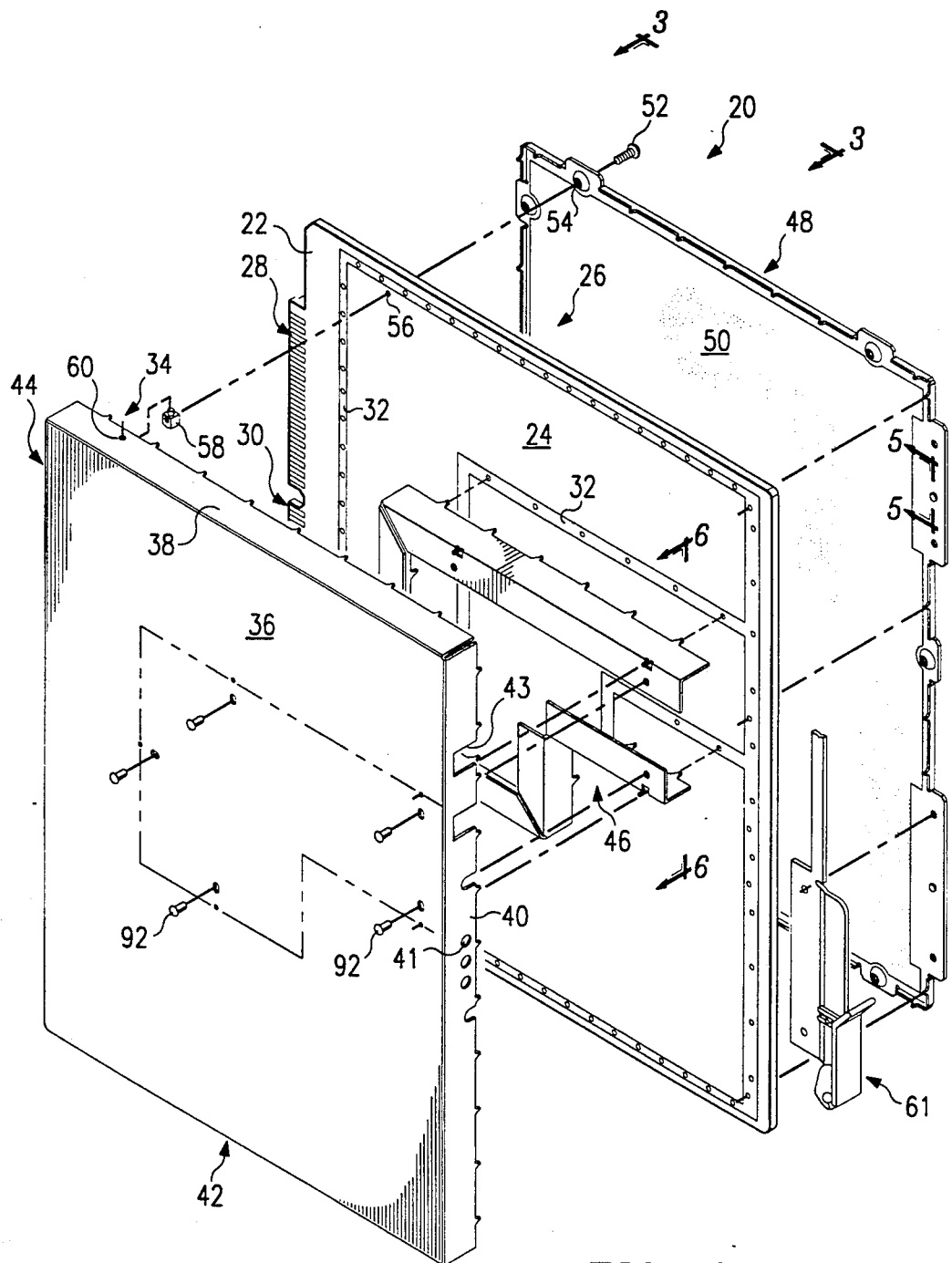
FIG. 2 shows an exploded view of the preferred embodiment of the present invention.

FIG. 2 shows the preferred embodiment of the printed circuit board shielding method and apparatus 20 of the present invention that together with associated electronic circuitry forms electronics module 10 of FIG. 1. Referring to FIG. 2, printed circuit board 22 includes top side 24 and bottom side 26 for connecting and holding electronic circuitry (not shown). Electrical leads or traces 28 and 30 may connect printed circuit board 22 to associated receptacles of the communications electronics cabinet 14 of FIG. 1. Additionally, printed circuit board 22 includes electrically conductive layer or perimeter 32 designed to surround electronic circuitry installed on top side 24. The shield apparatus 20 of the preferred embodiment includes top portion 34 having integral to it top shield 36 and side shields 38, 40, 42 and 44. Side shield 40 permits connecting various coaxial cable connectors as well as displaying internal display lights, test points or other indications on the electronic circuitry through openings such as opening 41. Additionally, opening such as opening 43 permit coaxial cable connectors or other connectors to pass through top cover 34 for electrical connection to the internal electronic circuitry. Internal shield 46 may attach to the internal side of top cover 34.

On bottom side 26 of printed circuit board 22 attaches bottom cover 48. Bottom cover 48 includes insulating material 50 to electrically separate the electronic circuitry that may protrude from bottom side 26 to the shield material of bottom cover 48. Insulating material 50, however, may not be necessary if bottom cover 48 is sufficiently tall to prohibit contact with circuitry that may pass through the bottom of printed circuit board 22. Several screws such as screw 52 pass through associated holes 54 of bottom cover 48 and holes 56 of printed circuit board 22 to screw blocks 58. Blocks 58 mount to top cover 34 through mounting holes 60. The preferred embodiment may also include handle 61 to permit the removal of electronics module 10 from card cage 12 of communications electronics cabinet 14 of FIG. 1, for example.

As FIG. 2 illustrates, the preferred embodiment provides top cover 34 and bottom cover 48 that grip between them printed circuit board 22. Top cover 34 is made of aluminum in the preferred embodiment, however, other electrically conductive materials capable of effectively shielding EMI such as copper or steel may also be used. Although the preferred embodiment uses a single integral top cover 34, top cover 34 may be made with a single piece top shield 36 and side shields 38, 40, 42, and 44 made of one, two, three or four separate sides. These pieces may then connect together with top shield 36 to fit as a unit over printed circuit board 22. For example, side shields 38, 42, and 44 may be formed of a single C-shaped strip of conductive material with side 40 and top shield 36 as separate pieces of shielding. If the top shield 36 of top cover 34 is a separate piece, a foil gasket backed with a silicone material may be necessary to assure a good electrical connection between top shield 36 and the side shields 38, 40, 42 and 44.

Bottom cover 48 typically is made of the same material as top cover 34, but other materials capable of shielding EMI may also be used. Insulating material 50 typically is a sheet of plastic or other material that adheres to bottom cover 98. Fastening means other than screws 52 to blocks 58 may also be used. For example, rivets or a press fitting may be used to grip printed circuit board 22 between top cover 34 and bottom cover 48.

Figure 3:
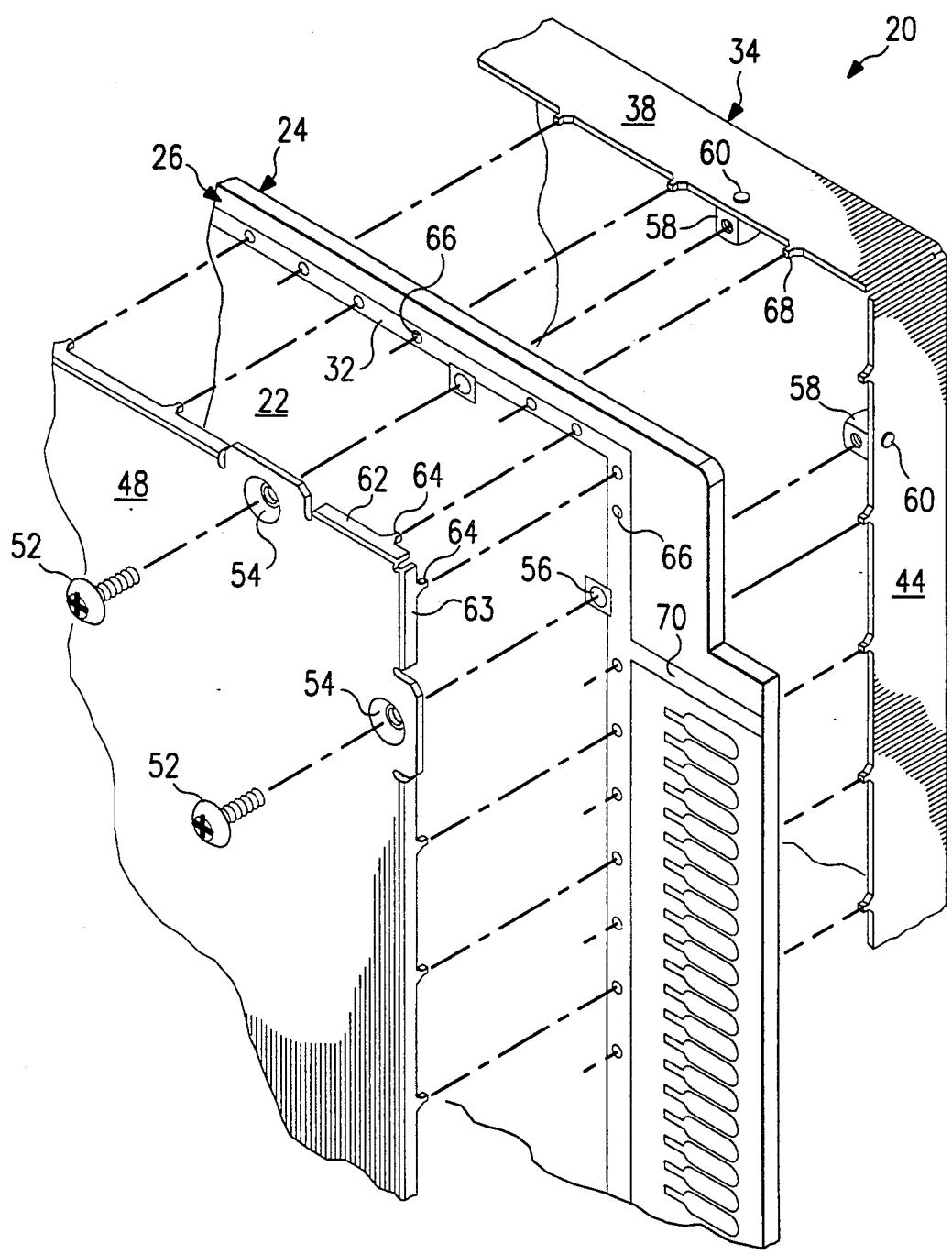
FIG. 3 shows a more detailed, exploded partial view of the preferred embodiment for more particularly illustrating the cooperation among its various components.

FIG. 3 provides a more detailed view of shield apparatus 20 of FIG. 2 to illustrate more precisely the mechanical cooperation of the EMI shield components of the preferred embodiment. Referring to FIG. 3, bottom cover 48 has vertical sides 62 and 63 that include tangs such as tangs 64. Tangs 64 fit into certain of conductive paths or channels 66 of perimeter 32. The height of sides 62 and 63 is sufficient to permit recessing screws 52 within holes 54 of bottom cover 48 so that when screwed down, the heads of screws 52 are flush with the outer surface of back cover 48. The height of hole 54 also minimizes distortion of sides 62 and 63 occurs when screw 52 is screwed down.

Vertical sides 38 and 44 of top cover 34 also appear in FIG. 3. On vertical sides 38 and 44 are tangs such as tang 68 that fit in the remaining channels 66 of printed circuit board 22. It should be noted that perimeter 32 of printed circuit board 22 appears as a conductive metal layer on both top side 24 and bottom side 26 of printed circuit board 22. Channels 66 penetrate fully through printed circuit board 22 for receiving either tangs 64 from bottom cover 48 or tangs 68 from top cover 34. Channels 66 have an internal conductive layer that electrically connects to perimeter 32. Perimeter 32 connects to ground lead 70. Ground lead 70 provides a way to electrically connect perimeter 32 and channels 66 to an electrical ground.

As FIGS. 2 and 3 illustrate, the preferred embodiment provides an EMI-shielded enclosure that is simple to place over and remove from the electronic circuitry of printed circuit board 22. In particular, no welding or soldering of side shields 38, 40, 42, and 44, is necessary with the preferred embodiment. Moreover, channels 66 and screw holes 56 form an EMI barrier that prevents EMI from passing through the edge of printed circuit board 22 and into the interior of the EMI shield enclosure that top cover 34 and bottom cover 48 establish.

Screw holes 56 and channels 66 are spaced not more than approximately one-half inch from each other in the preferred embodiment. The one-half inch distance is a function of the frequency of the EMI for which the components inside the EMI shield are most susceptible. Additionally, the distance between tangs 62 of bottom cover 48 and tangs 68 of top cover 32 do not exceed one-inch in the preferred embodiment for the same reason. To accomplish this, tangs 62 generally alternate their engaging channels 66 with the tangs 68 engaging the remaining channels 66. It also warrants pointing out that openings 41 and 43 on side shield 40 (see FIG. 2) do not make an opening greater than one-inch in any direction.

If the frequency of EMI for which electronics circuitry of electronics module 10 is susceptible is higher than the 70 MHz EMI signal for which EMI shield apparatus 20 is designed, then it may be necessary to reduce the distance between tangs 64 on bottom cover 48 and tangs 68 on top cover 34.

Another significant benefit of the preferred embodiment is that it makes possible straddling a component of the printed circuit board. For example, circuitry that is not susceptible to EMI may be placed outside the EMI enclosure. By connecting circuitry through the printed circuit board and not in contact with either channels 66 or screw holes 56 it is possible to electrically connect between circuitry inside and circuitry outside the EMI shield.

It may be possible to establish an EMI enclosure without the use of channels 66 by having tangs 64 and 68 simply contact continuous perimeter 32. This, however, will not prohibit EMI from passing through printed circuit board 22, unless some form of conductive shield material other than the internal surfaces of channels 66 also penetrates printed circuit board 22 at the same spacing as channels 66.

Yet another advantage of the preferred embodiment exhibits is that it provides a significantly simpler assembly relative to prior art EMI enclosures. Not only does the preferred embodiment significantly reduce the necessary hardware (e.g., the prior art soldered and fastened EMI enclosure requires between 12 and 18 pieces of hardware such as screws for assembly, whereas the preferred embodiment requires between only 10 and 12 pieces of hardware), but also the preferred embodiment substantially reduces the piece part count (e.g., the prior art soldered and fastened EMI enclosure requires six pieces for shielding whereas the preferred embodiment needs only three pieces (i.e., top cover 34, insulator 50, and bottom cover 48)).

Yet another significant benefit of the preferred embodiment is that it may be completely assembled from a downward orientation. In other words, assembly of the preferred embodiment may occur by first placing top cover 34 with its internal side upward on a flat surface. The next step is to install printed circuit board 22 over top cover 32 to engage channels 66 with tangs 68. Next, if handle 61 is necessary, it may be placed on printed circuit board 22. Bottom cover 48 is then placed over printed circuit board 22 and handle 61 to engage channels 66 with tangs 64. Finally, screws 52 are installed in holes 54 to pass through printed circuit board 22 and to blocks 58 to fasten top cover 34 and bottom cover 48 to printed circuit board 22.

FIG. 4 provides a side view of a cut-away portion of vertical shield side 44 to show more particularly shield grounding tangs 68 and trace signal openings such as opening 72. Vertical sides 38, 40, and 42 also have positioning tangs 68, but not signal trace openings 72. As FIG. 4 shows, tangs 68 protrude from side 44 of top cover 34 to ensure electrical contact between top cover 34 and channels 66 of perimeter 32. Although the preferred embodiment uses rectangular tang tips such as tip 74, the tang tips 74 may be rectangular, square, oval or circular in cross-section depending on the particular ease of design of other parameters affecting their manufacture. Similarly, tang angles such as angle 76 permit tang tips 74 to be sufficiently small relative to the diameter of channels 66. This permits a significant amount of free play in the positioning of tangs 68 as they engage channels 66. With this level of free play, tang angles 76 assure that upon fastening top cover 34 to printed circuit board 22 a good electrical contact occurs. This assures that top cover 34 is electrically grounded. For this purpose, tang angle 76 may provide a straight edge, as in the preferred embodiment, or may form a quarter circle or curved edge, depending upon the applicable manufacturing limitations, if any.

An important consideration of the preferred embodiment, which has application as an EMI shield for a communications receiver module, is to admit traces into the receiving components of the electronic circuitry on printed circuit board 22. For example, electronics module 10 may contain circuitry that receives signals from traces that run to the outer edge of printed circuit board 22. For this purpose, side shield 44 of top cover 34 provides different side shield heights among certain of the alternating spaces between tangs 68. As FIG. 4 demonstrates, a difference $\delta$ in height between trace signal opening 72 and opening 78 exists. The height difference $\delta$ causes trace signal opening 72 to form a gap or opening equal to the difference $\delta$ in height between shield side 44 and printed circuit board 22 when top cover 32 fastens to printed circuit board 22. For the preferred embodiment, this opening having height $\delta$ has a width 80 of approximately one-inch due to the spacing of tangs 68. This gap or opening area provides a sufficiently long slot line to permit power to reach the electronic circuitry of electronics module 10. The one-inch separation, however, prevents undesirable EMI from passing through and affecting the EMI-susceptible electronic circuitry.

Maintaining the integrity of the EMI barrier at junctures between top cover 34 and printed circuit board 22 top side 24 and bottom cover 48 and bottom side 26 is an essential characteristic of the preferred embodiment. This may require modification of either printed circuit board 22, top cover 34, or bottom cover 48 when component placement restricts the ability to use tangs 68 or 64. For example, at the point where handle 61 (see FIG. 2) contacts bottom cover 48 it is not possible to easily use a positioning tang 64. FIG. 5 shows a cross-section of a portion of bottom cover 48 to illustrate how the preferred embodiment overcomes this situation.

FIG. 5 illustrates a half-shear 82 that may be used on bottom cover 48 to provide an EMI shield at the point where bottom cover 48 covers handle 61. By half-shearing bottom cover 48 to produce an indentation having a depth approximately one-half that of the thickness of the bottom cover 48 sheet metal, it is possible to maintain the integrity of the approximately one-inch EMI barrier at all points around bottom cover 48.

Figure 6:
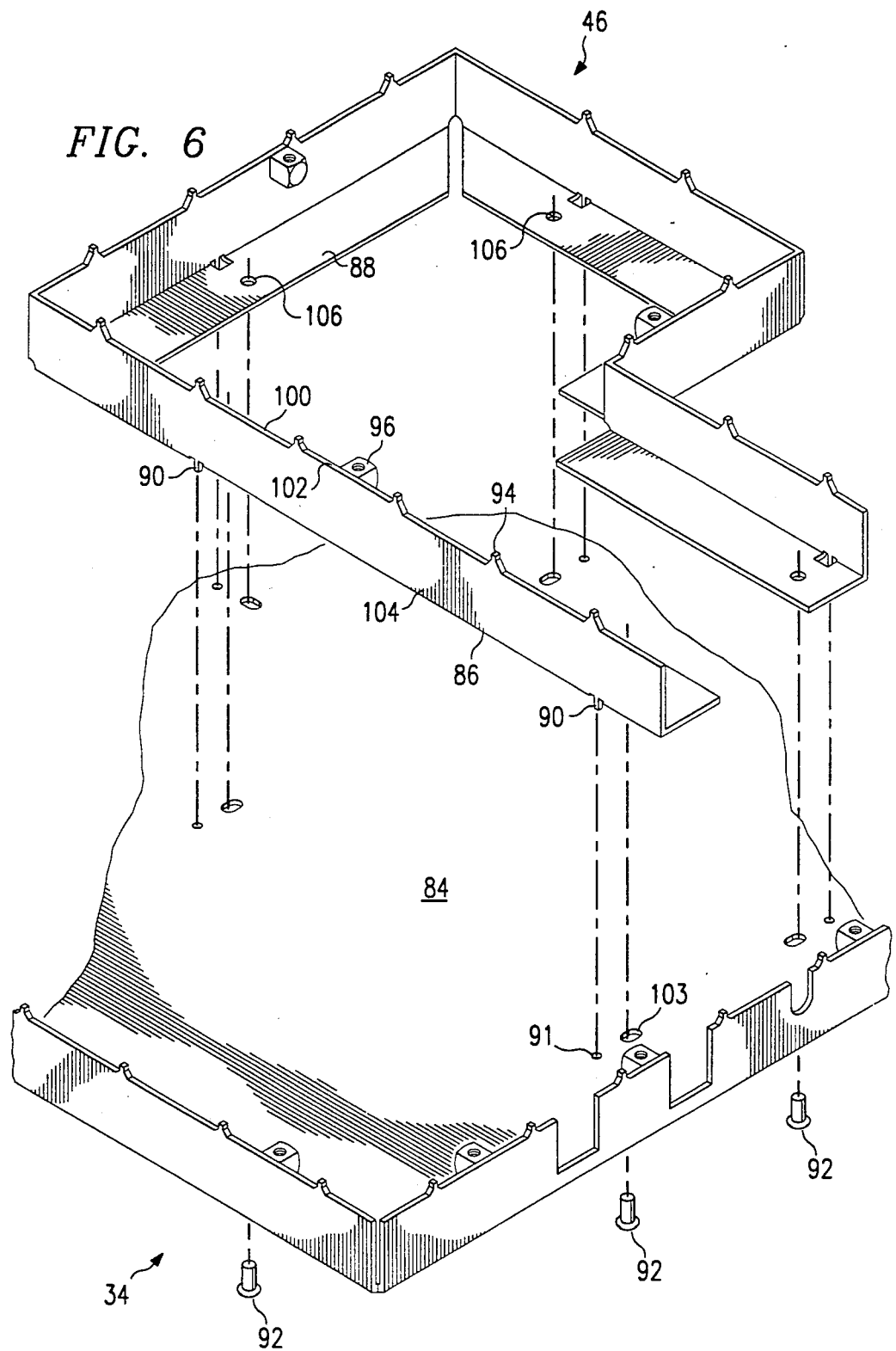
FIG. 6 is an exploded view of the top cover of the preferred embodiment that illustrates the placement and design of an internal shield of the preferred embodiment.

FIG. 6 illustrates an exploded isometric diagram of the EMI internal shield 46 of the preferred embodiment. In particular, EMI internal shield 46 contacts top cover 34 on inside surface 84. Internal shield 46 has side shield surfaces that form vertical shield 86 that may follow the contour of a conductive layer placed within and be electrically connected to conductive perimeter 32 of the preferred embodiment. Such a conductive layer would surround a predetermined portion of the area for electronics circuitry on printed circuit board 22. The function of EMI internal shield 46 is to isolate a certain electronic circuits from within top cover 34. The embodiment that FIG. 6 shows has five straight surfaces that form vertical shield 86. Integral and perpendicular to vertical shield 86 is horizontal mounting edge 88. Mounting edge 88 folds parallel to inside surface 84 for placement thereon. In order to mount EMI internal shield 46 to inside surface 84, the preferred embodiment coordinates the use of self-positioning tangs such as self-positioning tang 90 and pop rivets such as pop rivet 92.

EMI Internal shield 46, like top cover 34 and bottom cover 48, includes tangs such as tang 94 to engage corresponding channels 66 that may be placed within the conductive layer on printed circuit board 22. Also similar to top cover 34, internal shield 46 uses blocks such as block 96 that mount to mounting hole 98 (not shown) to receive a fastening screw such as screw 52 of FIG. 2.

As FIG. 6 further illustrates, EMI internal shield 46 also has spaces to establish signal trace openings. To provide the signal trace openings, various edges of vertical side shield 86 such as edge 100 differ in height from other edges of vertical side shield 86 such as edge 102. This aspect is similar to the trace openings $\delta$ of the vertical side shield 44 as shown in FIG. 4. The height difference communication of desired signal traces from the internal circuitry to external connections on printed circuit board 22. The size and orientation of internal shield 46 depends on the desired electronic circuitry on printed circuit board 22 for which EMI internal shield 46 is necessary.

Positioning tangs 90 aid in self-positioning internal shield 46 on inside surface 84. Positioning tangs 90 extend beyond edge 104 of internal shield 46. When internal shield 46 is placed in contact with inside surface 84, positioning tangs 90 drop into holes such as hole 91 to align internal shield 46 to its proper location. When internal shield 46 is in position, pop rivets 92 pass through associated holes such as hole 103 of top cover 34 and hole 106 of mounting edge 88. Holes 103 may be slightly larger than the shaft of pop rivet to permit a slight degree of free play when fastening internal shield 46 to top cover 34. Once in place, pop rivets 92 may be forced or pressed to secure internal shield 46 to top cover 34. Mounting edge 88 makes an electrically conductive path with top cover 34. This causes any EMI that internal shield 46 may absorb to not only be conducted to ground through engaging tang 94, but also to top cover 34.

The contact that mounting edge 88 makes with inside surface 84 is also important. In prior art devices, the contact that a top cover may make with a vertical soldered shield is generally along a thin edge of the vertical soldered shield. In contrast, mounting edge 88 interfaces inside surface 84 along its flat, wide edge. This significantly limits the EMI that may pass through to the electronic circuits between inside surface 84 and mounting edge 88.

Positioning tangs 90 may be rectangular or square in shape depending on the particular manufacturing or design objectives or limitations. Other methods of fastening internal shield 46 to inside surface 84 may include screws, soldering, brazing, or press fitting or other methods of fastening. By fastening internal shield 46 to top cover 34, upon the removing top cover 34 all circuitry on printed circuit board 22 is immediately accessible for factory repair or replacement.

Also, positioning tangs 90 and engaging tangs 94 are located on and integral to the same surface of vertical shield 86. This eliminates most, and possibly all, potential misalignment problems that may occur in mounting internal shield 46 so that engaging tangs 94 easily engage associated channels 66. Internal shield 46 represents a significant improvement over prior art methods and apparatuses to isolate selected circuits on a printed board from other circuits within the EMI enclosure of the preferred embodiment. In particular, internal shield 46 is a solderless way of separating specific circuits from other circuits in the enclosure. This has the advantage of making those circuits accessible and not restricted in accessibility by the soldered vertical shield of the prior art.

Another technical advantage that internal shield 46 provides relates to the way that positioning tangs 90 cooperate with engaging tangs 94. By having self-positioning tangs 90 and engaging tangs 94 on the same vertical shield 88, alignment of engaging tangs 94 with the associated grounding channels of printed circuit board 22 is assured.

OPERATION

The basic operation of the preferred embodiment is very straight forward once conceived and comprises placing top cover 34 and bottom cover 48 so as to grip and hold firm printed circuit board 22. As EMI reaches the electronics module 10 that results when placing the appropriate circuitry on printed circuit board 22, from the top of the module top cover 34 prevents EMI from reaching and affecting the electronic circuitry side shields 38, 40, 42, and 44 prevent EMI from reaching the electronic circuitry from the sides. Back cover 48 prevents EMI signals from reaching the bottom portion of the circuitry positioned on printed circuit board 22. Although EMI might otherwise pass through the juncture between top cover 34 and printed circuit board 22 and, similarly, bottom cover 48 and printed circuit board 22, positioning tangs 68 and 64, respectively, together with channels 66 prevent this from happening.

The EMI signals of concern for the preferred embodiment have a frequency of approximately 70 MHz. This frequency yields a signal with an approximately 168-inch wavelength. A factor of 30 divides this wavelength to specify the maximum hole size for the EMI shield. The 30 factor produces a maximum hole serving of 5.6 inches. The preferred embodiment protects the electronic circuitry from the fifth harmonic of the EMI, and thus requires a 1.12 inch maximum hole spacing. As a result, strong levels of EMI do not reach the electronic circuitry that EMI shield apparatus 20 protects. In fact, testing of the EMI shield of the preferred embodiment shows a 6 dB improvement over the prior art EMI shielding mechanisms designed to protect susceptible electronic circuits.

The operation of internal shield 46 of FIG. 6 provides similar EMI shield operation. Additionally, internal shield 46 isolates circuitry within internal shield 46 from other circuitry in electronics module 10.

The operation of the preferred embodiment may also extend to using the present invention to prevent EMI transmission from an electronics module. If EMI shield apparatus 20 were to enclose a communications transmitter module, it would prevent EMI from leaving EMI-generating circuitry. When used in this way, EMI shield apparatus 20 not only serves to shield susceptible electronic circuitry from EMI, but also may be used to prevent transmission of EMI so as to enhance electromagnetic compatibility within a communications electronics cabinet.

EMI shield apparatus 20 provides a high degree of electromagnetic compatibility (EMC) among adjacent electronic modules 10. As use herein, electromagnetic compatibility is the ability of electronic system to function properly in its intended electromagnetic environment and not be a source of electromagnetic signal pollution to that environment. This enhances the operation of other units within card cage 12 of FIG. 1, for example. The preferred embodiment of the present invention achieves a high degree of EMC by significantly reducing the amount of EMI reaching susceptible components within the electronic circuitry of electronics module 20, while at the same time preventing the leakage of the EMI from components that operate within the shielded environment of the preferred embodiment.

The operation of EMI internal shield 46 also is straight forward once conceived. Installation comprises mounting EMI internal shield 46 to inside surface 84. Once installed, by placing top cover 34 over printed circuit board 22, engaging tangs 94 engage associated channel 66. This causes any electronic circuits inside EMI internal shield 46 to be protected not only from EMI that may come from a source external to the electronics module 10, but also EMI that may come from associated electronic circuitry within the EMI shield apparatus 20 that is external to internal shield 46. Thus, as EMI reaches internal shield 46, internal shield 46 may absorb or reflect the EMI and, thereby, keep it from reaching and effecting the electronic circuitry within internal shield 46.

In summary, we have illustrated one embodiment of the inventive concept of an EMI shield apparatus that encloses a printed circuit board and that permits easy, solderless installation while producing a highly EMI-shielded electronics module by placing around the susceptible circuitry an EMI shield layer that prohibits EMI from passing through the edges of the circuitry and gripping the printed circuit board between an EMI shield top cover and an EMI shield bottom cover with specially designed tangs integral to the top and bottom covers to make connections to the EMI layer on the printed circuit board while permitting extensive communication of desired radio frequency and electrical signals with the enclosed electronic circuitry.

We wish to be limited, not by the single embodiment illustrated and described, but only by the scope of the appended claims wherein we claim:

1. An internal shield assembly for isolating a first electronic circuit from a second electronic circuit and preventing EMI from reaching the first electronic circuit, comprising:
   a printed circuit board for holding the first and second electronic circuits and comprising a plurality of leads for permitting electrical connection to the first electronic circuit;
   an electrically conductive perimeter comprising an electrically conductive layer integral to said printed circuit board and surrounding the first electronic circuit, said leads passing under said perimeter to an edge of said printed circuit board;
   a side shield surrounding the first electronic circuit, said side shield comprising a first electrically conductive side shield material for shielding a side aspect of the first electronic circuit from EMI, said side shield further comprising a mounting shield material, a predetermined set of apertures, a plurality of engaging tangs and a plurality of positioning tangs, said predetermined set of apertures for permitting said leads to pass to the first electronic circuit and having its greatest linear dimension less than a predetermined dimension, said predetermined dimension inversely proportional to frequency and desired percent shielding of the EMI, said engaging tangs for connecting said side shield material to said electrically conductive perimeter, said positioning tangs co-planar with said engaging tangs, said positioning tangs for alignment of said side shield with a top shield;
   said top shield for covering and isolating the first electronic circuit from EMI, said top shield associated with said mounting shield material for mounting said side shield to said top shield for limiting the amount of EMI passing through the point of mounting to the first electronic circuit;
   a bottom shield for covering and isolating a bottom aspect of the first electronic circuit from EMI;
   fastening means for fastening said top shield, said side shield and said bottom shield to said electrically conductive perimeter for establishing a EMI shield enclosure for the first electronic circuit while permitting exposure of electrical leads to the first electronic circuit.

2. A printed circuit board subassembly for containing a first electronic circuit and isolating a second electronic circuit and EMI from the first electronic circuit, comprising:
   holding means for holding the first and second electronic circuits and comprising electrical connection means for electrically connecting external circuitry to the first electronic circuit;
   electrically conductive means integral to said holding means and surrounding the first electronic circuit, said electrically conductive means permitting said electrical connection means to pass under said electrically conductive means to an edge of said holding means;
   internal shield means surrounding the first electronic circuit, said internal shield means comprising a side shield means for shielding the first electronic circuit from EMI, said internal shield means further comprising a mounting shield means, a predetermined set of apertures, and a plurality of internal shield connecting means, said predetermined set of apertures for permitting passage of said electrical connection means to the first electronic circuit and having its greatest linear dimension less than a predetermined dimension, said predetermined dimension inversely proportional to frequency and desired percent shielding of the EMI, said shield connecting means for connecting said side shield means to said electrically conductive means;
   top shield means for covering and isolating a top portion of the first electronic circuit from EMI, said top shield means associated with said mounting shield means for mounting said side shield means to said top shield means;
   bottom shield means for covering and isolating a bottom portion of the first electronic circuit from EMI;
   fastening means for fastening said top shield means, said internal shield means and said bottom shield means to said electrically conductive means for establishing an EMI shield enclosure for the first electronic circuit while permitting exposure of said electrical connecting means.

3. A method for restricting communication of EMI signals among a plurality of electronic circuits on a printed circuit board, comprising the steps of:
   holding the plurality of electronic circuits on a printed circuit board;
   surrounding a first portion of the plurality of electronic circuits with an electrically conductive perimeter comprising an electrically conductive layer integral to said printed circuit board and passing a plurality of electrical signal traces under said perimeter to an edge of said printed circuit board;
   surrounding and separating said first portion from the remaining of said plurality of electronic circuits with an internal shield, said internal shield comprising a side shield material for shielding said first portion from EMI, said internal shield further comprising a mounting shield material, a predetermined set of apertures, a plurality of connecting tangs, and a plurality of aligning tangs, said predetermined set of apertures for permitting said leads to traverse said side shield material from said first portion and having its greatest linear dimension less than a predetermined dimension, said predetermined dimension inversely proportional to frequency and desired percent shielding of the EMI, said connecting tangs for connecting said internal shield to said electrically conductive perimeter;
   covering and isolating said first portion of electronic circuits from EMI with a top shield, said top shield associated with said mounting shield material for mounting said internal shield to said top shield, said aligning tangs further for aligning said mounting shield material to a predetermined mounting position on said top shield;
   covering and isolating a bottom aspect of said first portion of electronic circuits from EMI using a bottom shield;
   fastening said top shield, said internal shield, and said bottom shield to said electrically conductive perimeter for establishing an EMI shield enclosure for said first portion and permitting exposure of said electrical leads.

4. An apparatus of the described class for selectively isolating EMI from a plurality of electronic circuits on a printed circuit board while permitting exposure of electrical leads to the plurality of electronic circuits, comprising:
- a printed circuit board for holding the plurality of electronic circuits and comprising a plurality of leads for permitting electrical connection to a first portion of the plurality of electronic circuits;
- an electrically conductive perimeter comprising an electrically conductive layer, said layer integral to said printed circuit board and surrounding said first portion while permitting said leads to pass under said perimeter to an edge of said printed circuit board;
- a side shield surrounding said first portion of electronic circuits and separating said first portion from the remaining of the plurality of electronic circuits, said side shield comprising side shield material for shielding said first portion from EMI, said side shield further comprising a mounting shield material, a predetermined set of apertures, a plurality of connecting tangs, and a plurality of aligning tangs, said predetermined set of apertures for permitting said leads to pass to said first portion of electronic circuits and having its greatest linear dimension less than a predetermined dimension, said predetermined dimension inversely proportional to frequency and desired percent shielding of the EMI, said connecting tangs for conductively connecting said side shield material to said electrically conductive perimeter;
- a top shield for covering and isolating a top aspect of said first portion from EMI, said top shield associated with said mounting shield material for mounting said side shield to said top shield at a mounting point for limiting the amount of EMI passing through said mounting to said first portion, said aligning tangs further for aligning said mounting shield material to said mounting point on said top shield;
- a bottom shield for covering and isolating a bottom aspect of said first portion of electronic circuits from EMI;
- fastening means for fastening said top shield, said side shield and said bottom shield to said electrically conductive perimeter for establishing a EMI shield enclosure for said first portion of said electronic circuits while permitting exposure of electrical leads.

5. A method for restricting communication of EMI signals with an internal circuit of electronic circuitry on a printed circuit board, comprising the steps of:
- holding the electronic circuitry on a printed circuit board and permitting electrical connection to the electronic circuitry through a plurality of signal traces;
- surrounding the internal circuit with an electrically conductive perimeter and passing said signal traces through said perimeter to an edge of said printed circuit board but without making conductive contact with said perimeter;
- surrounding the internal circuit and separating the internal circuit from a remaining portion of the electronic circuitry with a side shield, said side shield comprising a side shield material for shielding said internal circuit from EMI, said side shield further comprising a mounting shield material, a predetermined set of trace openings, a plurality of connecting tangs, and a plurality of aligning tangs, said predetermined set of trace openings for permitting said signal traces to pass to the internal circuit and having its greatest linear dimension less than a predetermined dimension, said predetermined dimension inversely proportional to frequency and desired percent shielding of the EMI, said connecting tangs for connecting said side shield material to said electrically conductive perimeter;
- isolating the internal circuit from EMI with a top shield comprising a first electrically conductive shield material, said top shield associated with said mounting shield material for mounting said side shield to a mounting point on said top shield, said aligning tangs further for aligning said mounting shield material to a predetermined position on said top shield, said connecting tangs and said aligning tangs being integral to said side shield material for alignment of said connecting tangs to said perimeter;
- covering and isolating a bottom aspect of the internal circuit from EMI with a bottom shield;
- fastening said top shield, said side shield and said bottom shield to said electrically conductive perimeter to establish an EMI shield enclosure for the internal circuit while permitting exposure of electrical leads to the internal circuit.

6. An internal shield apparatus for selectively isolating EMI from an internal circuit of electronic circuitry on a printed circuit board, comprising:
- a printed circuit board for holding the electronic circuitry and comprising a plurality of signal traces for permitting electrical connection to the electronic circuitry;
- an electrically conductive perimeter for surrounding the internal circuit, said printed circuit board and perimeter associated to permit said signal traces to pass under said perimeter to an edge of said printed circuit board;
- a side shield surrounding the internal circuit and separating the internal circuit from a remaining portion of the electronic circuitry, said side shield comprising a side shield material for shielding said internal circuit from EMI, said side shield further comprising a mounting shield material, a predetermined set of trace openings, a plurality of engaging tangs, and a plurality of aligning tangs, said predetermined set of trace openings for permitting said signal traces to pass to the internal circuit and having its greatest linear dimension less than a predetermined dimension, said predetermined dimension inversely proportional to frequency and desired percent shielding of the EMI, said connecting tangs for engaging said side shield material with said electrically conductive perimeter;
- a top shield for isolating the internal circuit from EMI, said top shield associated with said mounting shield material for mounting said side shield to said top shield, said aligning tangs further for aligning said mounting shield material to a predetermined position on said top shield, said connecting tangs and said aligning tangs being integral to said side shield material for alignment of said connecting tangs to said perimeter;
- a bottom shield for covering and isolating a bottom aspect of the internal circuit from EMI;

fastening means for fastening said top shield, said side shield, and said bottom shield to said electrically conductive perimeter for establishing a EMI shield enclosure for the internal circuit while permitting exposure of said electrical leads.

7. An EMI shielding apparatus for printed circuit boards that prevents communication of external EMI with circuits on a printed circuit board and for preventing communication of EMI of a first circuit on said printed circuit board with other circuits on said printed circuit board, comprising:

said printed circuit board for holding said first and a second or more electronic circuits and further comprising a plurality of leads for permitting electrical connection to the first electronic circuit;

an electrically conductive perimeter surrounding said printed circuit board, said conductive perimeter being grounded;

an electrically conductive outline of said first circuit, said conductive outline being grounded the same as said conductive perimeter;

conductive channels formed through said conductive perimeter and conductive outline on said printed circuit board;

a top cover made of a shielding material formed to cover the top, or component side, of the printed circuit board or a portion thereof, and further comprising conductive tangs for making solderless conductive connection to said perimeter in said conductive channels, said top cover further comprising apertures for allowing electrical leads into said top cover, said apertures sized so that its greatest linear distance is less than a predetermined distance, said predetermined distance inversely proportional to the frequency and the desired percent shielding of the EMI, mounting holes to work in combination with a fastening means to secure a side shielding panel to said top cover, said top cover formed of a single integral piece of metal;

a bottom cover made of a shielding material formed to cover the bottom side of said printed circuit board or a portion thereof and further comprising tangs for making solderless and gasketless conductive connection to said perimeter and said conductive channels, said bottom cover co-extensive with said top cover, said conductive tangs coordinated with said conductive tangs of said top cover so that said conductive tangs of said bottom cover and said conductive tangs of said top cover engage said conductive channels in an alternating fashion, said bottom cover formed of a single integral piece of metal;

fastening means to fasten said top cover to said printed circuit board and said bottom cover to said printed circuit board;

said shielding panel comprising a shielding material formed to have a surface within the plane of said top cover and a surface perpendicular to said printed circuit board, said side shielding panel further comprising positioning tangs, or pins, for aligning said side shielding material to said mounting holes in said top cover, fastening means for fastening said side shielding panel to said top cover after alignment with said positioning tangs, a series of conductive tangs located on said side shielding panel and co-planar to said positioning tangs so as to engage said conductive channels located on said conductive outline of said first circuit when said top cover is fastened by said fastening means to said printed circuit board.

* * * * *